United States Patent [19]
Park

[11] Patent Number: 5,933,220
[45] Date of Patent: Aug. 3, 1999

[54] APPARATUS AND METHOD FOR LIMITING DOUBLE EXPOSURE IN STEPPER

[75] Inventor: Soon-jong Park, Yongin, Rep. of Korea

[73] Assignee: Samsung Electronics Co., Ltd., Suwon, Rep. of Korea

[21] Appl. No.: 08/990,073

[22] Filed: Dec. 12, 1997

[30] Foreign Application Priority Data

Dec. 20, 1996 [KR] Rep. of Korea ........................ 96-69166

[51] Int. Cl.$^6$ ............................ G03B 27/72; G03B 27/42
[52] U.S. Cl. ................................. 355/71; 355/53
[58] Field of Search ................................. 355/53, 67, 71, 355/77, 68, 69; 356/28, 399, 400, 401; 250/205, 201.1

[56] References Cited

U.S. PATENT DOCUMENTS

| | | | |
|---|---|---|---|
| 4,512,657 | 4/1985 | Sakato | 355/68 |
| 4,713,675 | 12/1987 | Yui | 355/67 |
| 4,879,591 | 11/1989 | Takei | 358/29 |
| 5,079,583 | 1/1992 | Sato et al. | 354/435 |
| 5,114,223 | 5/1992 | Torigoe et al. | 353/101 |
| 5,157,700 | 10/1992 | Kurosawa et al. | 378/34 |
| 5,255,050 | 10/1993 | Kitagawa | 355/53 |
| 5,483,311 | 1/1996 | Sakakibara et al. | 355/53 |
| 5,591,958 | 1/1997 | Nishi et al. | 250/205 |
| 5,777,744 | 7/1998 | Yoshii et al. | 356/372 |

*Primary Examiner*—Safet Metjahic
*Assistant Examiner*—Hung Henry Nguyen
*Attorney, Agent, or Firm*—Jones Volentine, L.L.P.

[57] ABSTRACT

An apparatus and method for limiting double exposure in a stepper with a shutter that alternately passes and blocks a light beam for fabrication of semiconductor devices. The apparatus has a light sensor that detects light passed by the shutter and produces a sensing signal related to the light passed. A double exposure detector receives the sensing signal and produces an error signal related to the sensing signal. An exposure controller connected to the detector and connected to the shutter, receives the error signal and produces a shutter-driving control signal.

32 Claims, 6 Drawing Sheets

APPARATUS AND METHOD FOR LIMITING DOUBLE EXPOSURE IN STEPPER

BACKGROUND OF THE INVENTION

1. Field of the Invention

The present invention relates to an apparatus and method for limiting double exposure in a stepper. More particularly, the present invention relates to an apparatus and method which detect whether a shutter in the stepper is tightly closed when an exposing process stops, and limits double exposure by preventing further operation on the same or different wafers when the shutter is not tightly closed.

2. Description of the Related Art

During the normal fabrication of a semiconductor device, a wafer repeatedly passes through processes such as cleaning, diffusion, photolithography and ion-implantation. Each process requires a separate apparatus. Photolithography is a technique to form a mask image as a pattern of photoresist on a wafer. Photolithography consists of four steps: coating the wafer with a photosensitive material, aligning the wafer and exposing it to light patterned by the mask, developing the exposed photosensitive material on the wafer, and inspecting the wafer. The alignment and exposure are carried out in a stepper. Processing effectiveness in photolithography depends on how precisely the mask image is aligned on the wafer, i.e., how accurately the image is projected onto a given location on the wafer, and precisely how long the photoresist on the wafer is exposed.

In a stepper, the exposure principle is similar to that of a camera. That is, a light beam generated from a light source passes through a shutter depending on whether the shutter is opened or closed. The light passing through the shutter is then passed through a mask, focused, and projected onto a device area of a wafer, exposing the photosensitive material there in the mask pattern. The light is then blocked as the shutter is closed, and the wafer is moved to a new position, ready for the exposure of the next device area. The process is repeated for every device area on the wafer that is to be exposed. Thus, the wafer is alternately exposed to the light beam through the mask when the shutter is open and advanced to a new position when the shutter is closed, so that the photosensitive layer on the wafer is selectively exposed in the device areas.

In a conventional stepper, exposure is controlled by timing. The opening and shutting times of the shutter are adjusted depending on exposure time required for the particular photosensitive material and the device being fabricated. However, in some cases the opening and shutting operations of the shutter may not be performed exactly as designed. Improper performance can be due to aging of the motor or other system failure, such as a shutter that does not completely open or close, or a shutter that has one or more blades that are bent out of phase.

Figure 1:
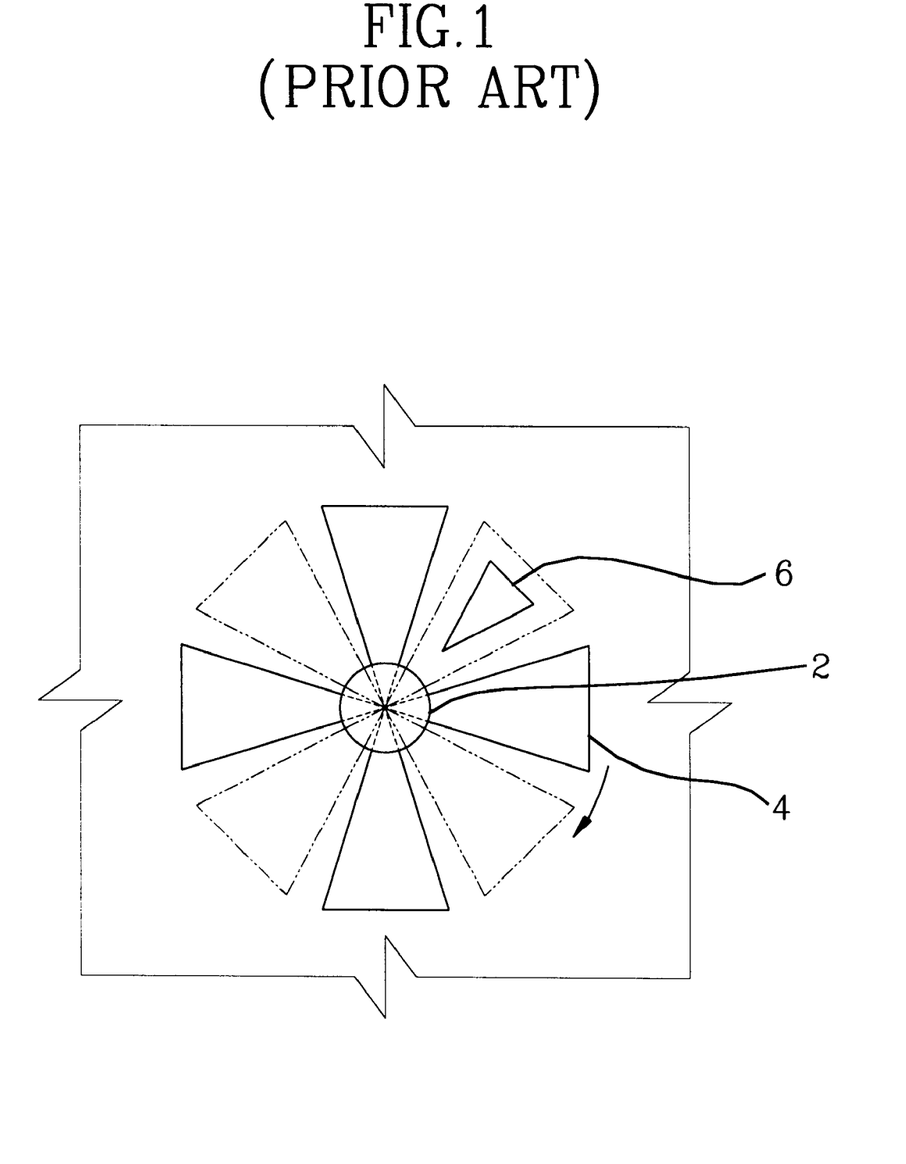
FIG. 1 is a diagram for explaining the operation of the shutter in a conventional stepper.

FIG. 1 shows the shutter of a conventional stepper. A light beam from a light source proceeds to an optical system through a window 6 of the shutter. The shutter is opened or closed by rotating a blade 4 using a stepping motor 2. However, if the phase of blade 4 is displaced, window 6 is not exactly opened or closed. Then, even though the shutter should be closed by design and according to time, the window is not entirely blocked, and some light is passed by the shutter.

If the repeated sequence of exposure and wafer movement is carried out in a stepper whose shutter's opening and shutting operations are not properly performed, the wafer is not correctly exposed. Device areas of the wafer that should be exposed may not get enough light. Furthermore, when the wafer is moved or when stepper operations are halted for a few seconds when the shutter should be closed, undesigned exposure may occur, i.e., double exposure or overexposure may occur since the shutter is erroneously opened. The conventional stepper has no capability to detect such double exposure. Thus, the undesirable exposure is performed without knowledge of the operators, thereby producing large numbers of poor quality wafers.

A need exists, therefore, for an apparatus that will detect the occurrence of double exposure in a stepper. Furthermore, the apparatus should determine when undesired exposure is occurring and modify the stepper operation in response.

SUMMARY OF THE INVENTION

Accordingly, the present invention is directed to an apparatus that substantially overcomes one or more of the problems due to limitations and disadvantages of the related art.

An object of the present invention is to provide an apparatus for limiting double exposure in a stepper which occurs when light from a light beam passes through a shutter that should be closed.

Another object is to prevent such double exposure from being carried out on other device areas on the same or different wafers placed in the stepper.

To achieve these and other advantages, the present invention provides an apparatus for limiting double exposure in a stepper with a shutter that alternately passes and blocks a light beam for fabrication of semiconductor devices. A light sensor detects light passed by the shutter and produces a sensing signal related to the light passed. A double exposure detector receives the sensing signal and produces an error signal related to the sensing signal. An exposure controller connected to the detector and connected to the shutter, receives the error signal and produces a shutter-driving control signal.

In an embodiment of the present invention, the double exposure detector includes a light-level comparison circuit, a shutter status circuit, a light-level logic circuit, and a relay circuit. In other embodiments of the invention a reference voltage supply is added, an alarm is added, a vacuum sensor is added, and the exposure controller is connected to a wafer driver in the stepper to stop moving the wafer, in various combinations.

Another aspect of the invention is a method for limiting double exposure. The method includes sensing a light level of light passed by the shutter and generating a sensing signal related to the sensed light level. The method includes additional steps of establishing a reference voltage equivalent to the level of the sensing signal when the shutter passes light for exposing a wafer, amplifying the sensing signal about 100 times to produce an amplified sensing signal, and comparing the amplified sensing signal to the reference voltage to produce a light level comparison output which is at a low level when the amplified sensing signal exceeds the reference voltage, i.e., when the light level is greater than about one per cent of the level designed for exposing a wafer. The method also involves tapping a shutter-driving control signal produced by an exposure controller connected to the shutter and determining when the shutter should be closed based on the shutter-driving control signal. Then there is the step of producing an error signal at a high-error level when the light level comparison output is at the low level substantially simultaneously with when the shutter should be closed, and producing an error signal at a low-error level otherwise.

BRIEF DESCRIPTION OF THE DRAWINGS

The accompanying drawings illustrate the structure and operation of the invention and preferred embodiments, in which.

DETAILED DESCRIPTION OF THE INVENTION

Reference will now be made in detail to the present invention and the preferred embodiments. The invention is directed to an apparatus and method for limiting double exposure in a stepper with a shutter that alternately passes and blocks a light beam for fabrication of semiconductor devices. The objects and additional features and advantages of the invention will be apparent from the description of the structures and methods of the invention and the preferred embodiments, or may be learned by practice of the invention.

Figure 2:
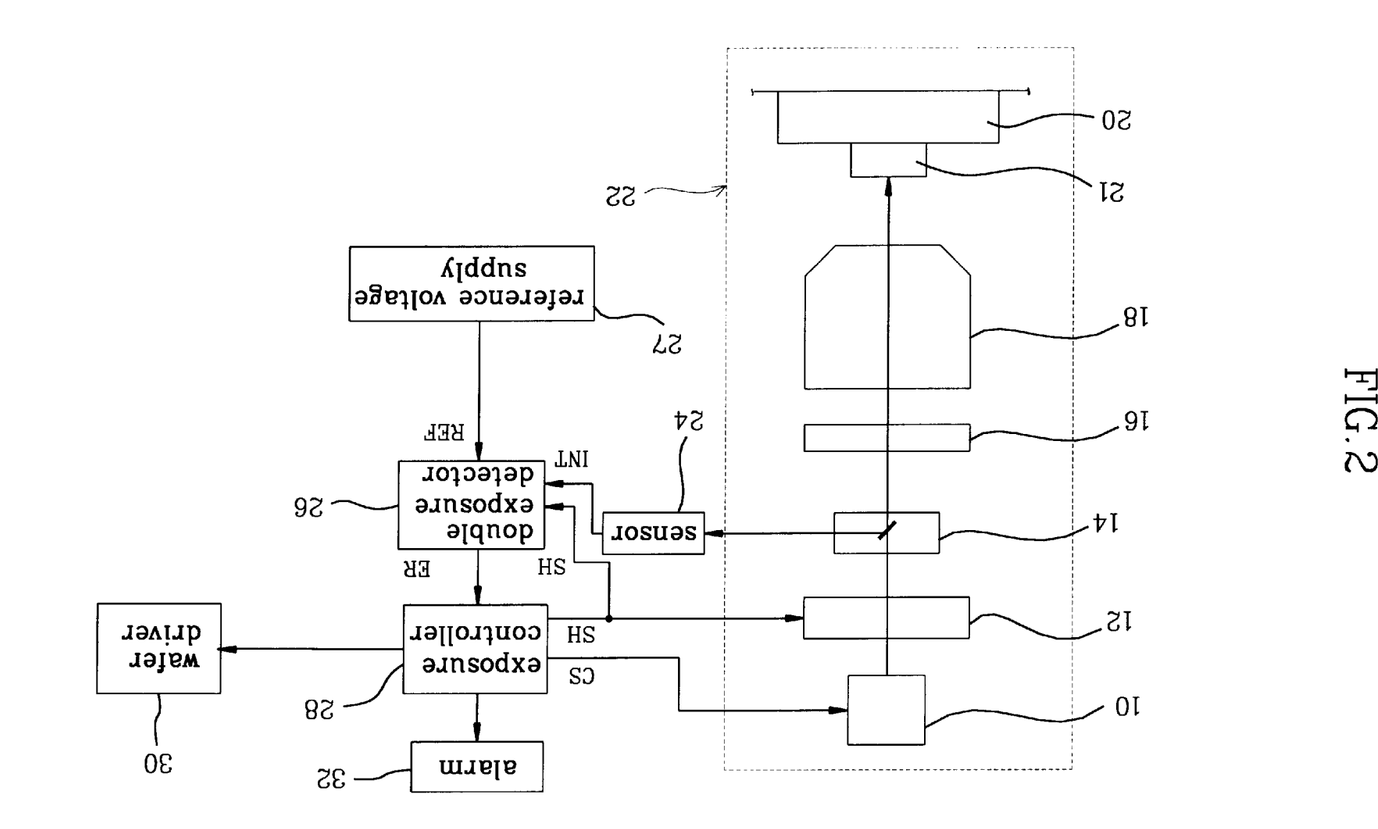
FIG. 2 is a block diagram of an apparatus for preventing double exposure in a stepper, in accordance with one embodiment of the present invention.

FIG. 2 is a block diagram of a stepper interconnected with an apparatus for preventing double exposure, in accordance with an embodiment of the present invention. The stepper includes an exposure system 22 for exposing a wafer 21 placed on a stage 20. The exposure system 22 also includes a light source 10, a shutter 12, a reflector 14, a reticle 16, and lens assembly 18. The apparatus of the present invention includes a sensor 24 receiving light from the reflector 14 of the stepper exposure system 22, a double exposure detector 26 connected to the sensor 24, and an exposure controller 28 connected to the double exposure detector 26 and the shutter 12 of the stepper exposure system 22.

According to the invention, prior to the exposure of a wafer 21 in the stepper exposure system 22, the exposure controller 28 generates a shutter-driving control signal SH for operating the shutter 12, and a control signal CS for operating the light source 10. When the shutter 12 opens properly upon reception of the shutter-driving control signal SH, a light beam generated from light source 10 passes through shutter 12, and reaches the reflector 14 and the wafer 21. When shutter 12 closes properly, the light beam does not pass through shutter 12, and cannot reach the reflector 14 or the wafer 21. The invention operates by the light sensor 24 sensing light reflected by reflector 14 and producing a sensing signal INT, which is sent to the double exposure detector 26. The exposure controller 28 controls the exposure system 22 by applying the shutter-driving control signal SH to shutter 12, and by sending another control signal CS to the light source 10. The shutter-driving control signal SH is tapped off the connection between the exposure controller 28 and the shutter 12, and is applied to double exposure detector 26. A reference voltage supply section 27 provides a reference voltage REF input to the double exposure detector 26.

If the shutter does not operate properly, an error signal ER is produced by the double exposure detector 26 and sent to the exposure controller 28, depending on a comparison of the sensing signal INT, the shutter-driving control signal SH, and the reference voltage REF.

If the sensing signal INT indicates light is detected substantially simultaneously with when the shutter-driving control signal SH indicates that the shutter 12 should be closed, then the double exposure detector 26 produces an error signal ER that indicates an error condition has occurred. When the exposure controller 28 receives the error condition, the exposure controller 28 activates an alarm 32 and stops the wafer driver 30 which causes the stage 20 to stop advancing and to stop moving the wafer 21. Thus in the present invention, double exposure caused by an improperly operating shutter 12, due to aging of the motor 2 (FIG. 1) or other system failure, is detected by the double exposure detector 26 and limited by the exposure controller 28. This prevents double exposure of other device areas, and limits the damage caused by a shutter operating improperly.

In the preferred embodiment of the invention, the light sensor 24 is an integral light sensor and produces a sensing signal INT with a voltage proportional to a certain light level. The reference voltage supply 27 provides a reference voltage REF to the double exposure detector 26 that can be compared to the voltage level of the sensing signal INT. REF is used to define a threshold level of light that is considered to cause double exposure problems. Also, the shutter-driving control signal SH is preferably a digital signal for operating the shutter stepping motor.

Figure 3:
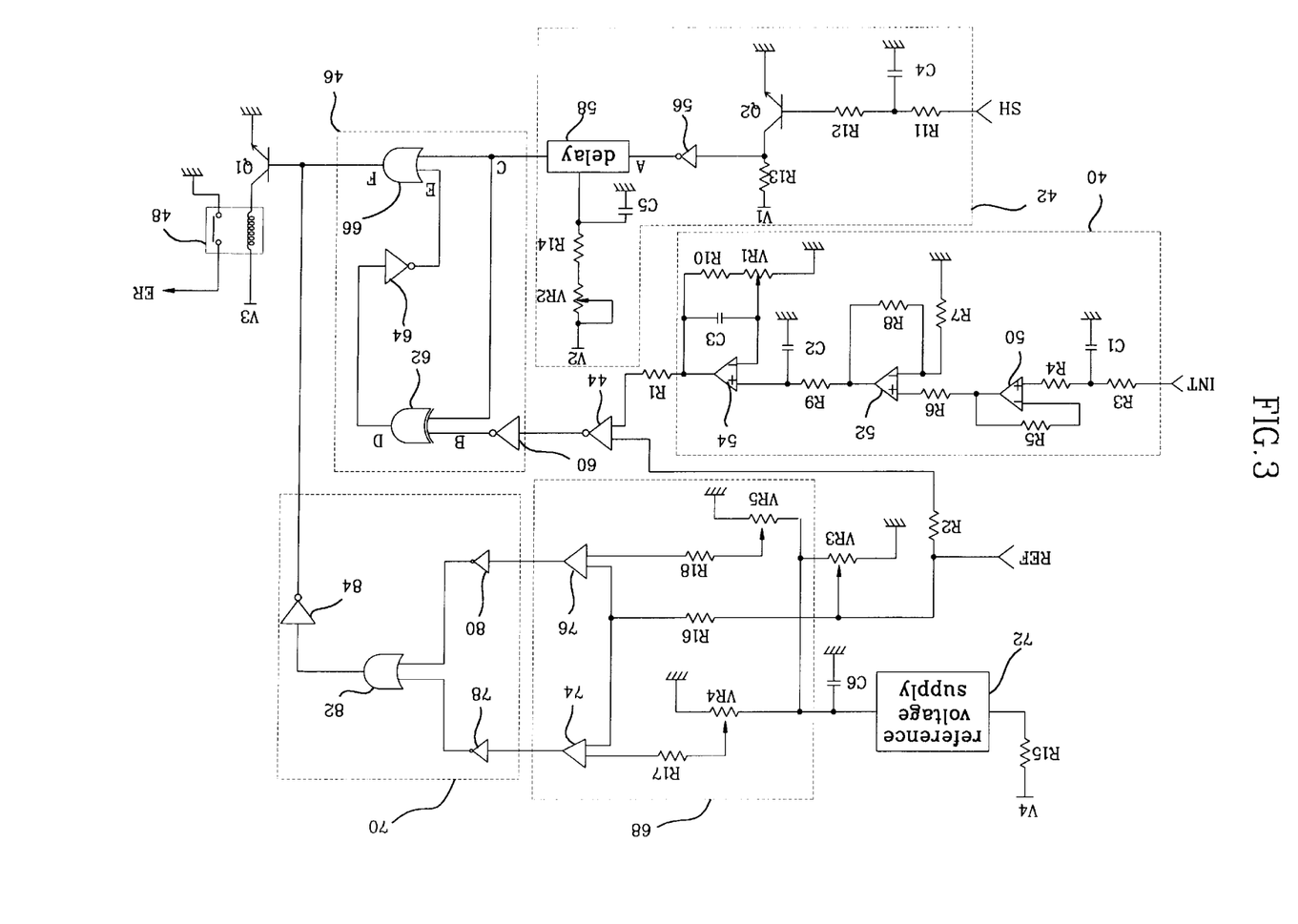
FIG. 3 is a circuit diagram of a double exposure detector of the apparatus of FIG. 2.

FIG. 3 shows a circuit diagram of the double exposure detector 26 for the preferred embodiment. In general, the double exposure detector 26 operates on the digital shutter driving control signal SH, the integral sensing signal INT, and the reference voltage REF, and produces the error signal ER.

Referring to FIG. 3, the double exposure detector 26 is constructed in such a manner that the sensing signal INT is applied to an inverting-amplifying circuit 40, and the shutter-driving control signal SH is applied to a shutter status circuit 42. The inverted-amplified signal (the output of the inverting amplifying circuit 40) is applied to one input of a comparator 44 through a resistor R1, and reference voltage REF is applied to the other input of comparator 44 through resistor R2. The resistors R1 and R2 and the comparator 44 constitute a comparison subcircuit. The comparison subcircuit and the inverting-amplifying circuit 40 together constitute a light-level comparison circuit.

The light-level comparison output from comparator 44 of the light-level comparison circuit is supplied with the shutter status output C from the shutter status circuit 42 to a light-level logic circuit 46. Light-level logic circuit 46 logically combines the two output signals, and generates a switching signal F. Switching signal F is applied to a relay circuit with a relay transistor Q1 driving a relay 48. Relay 48 outputs the error signal ER at a low-error level or a high-error level when transistor Q1 is turned on or turned off by the switching signal, respectively.

The inverting-amplifying circuit 40 includes a first light-level amplifier 50 for inverting sensing signal INT. It also includes a second light-level amplifier 52 and a third light-level amplifier 54 for amplifying the inverted sensing signal to a predetermined amplification level. The sensing signal INT is applied to the noninverting input (+) of first light-level amplifier 50 through resistors R3 and R4 to which a capacitor C1 is connected in parallel. A resistor R5 is connected between the inverting input (−) and the output of the first light-level amplifier 50. The non-inverting input (+) of second light-level amplifier 52 receives the inverted sensing signal from the output of first light-level amplifier 50 through a resistor R6. The inverting input (−) of the second light-level amplifier 52 is grounded through a resistor R7, and a resistor R8 is connected between the inverting input (−) and the output of the second light-level amplifier. The partly-amplified, inverted sensing signal output from the second light-level amplifier 52 is smoothed by a capacitor C2, and applied to the non-inverting input (+) of the third light-level amplifier 54 through a resistor R9. A capacitor C3, resistor R10 and a variable resistor VR1 are connected between the inverting input (−) and output of the third light-level amplifier 54 in parallel, where resistor R10 is grounded through the variable resistor VR1. Accordingly, the sensing signal INT is inverted by first light-level amplifier 50, and then amplified by the other two light-level amplifiers 52 and 54.

The inverted amplified signal is applied to one input of comparator 44 through a resistor R1, and the reference voltage REF is applied to the other input of the comparator 44 through a resistor R2. The reference voltage REF is set close to a predetermined level that corresponds to the output from the light sensor when the shutter 12 (FIG. 2) is open. A threshold light level is the amount of light considered to cause the problem of double exposure, for example, when the shutter is open one percent or more. The amplification factor is adjusted so that the voltage of the inverted amplified signal at the comparator 44 is higher than the reference voltage at the comparator 44 when the light detected is above the threshold light level. Thus, the amplification factor should be set to about 100 if a one percent open shutter causes double exposure. The amplification factor can be set by the ratio of resistor R6 to resistor R8, and the ratio of resistor R9 to resistor R10. The amplification factor can be finely adjusted by varying the load of the third light-level amplifier 54 using variable resistor VR1.

As described above, the sensor 24 that senses a light beam which passes through shutter 12 is an integral sensor. With a conventional integral sensor, the sensing signal level is 0 volts (V) when shutter 12 is completely closed, and the sensing signal level is −3V when the shutter is completely opened. In the preferred embodiment, the threshold light level occurs when the shutter 12 is opened approximately one percent and the sensing signal is about −0.03V. Thus, in the preferred embodiment, second and third light-level amplifiers 52 and 54 are set to amplify the sensing signal by one hundred times, i.e., the amplification factor is 100.

When shutter 12 is opened one percent or more, comparator 44 compares a voltage level of the inverted amplified signal from the inverting-amplifying circuit 40 with the reference voltage REF to produce the light-level comparison output. When the voltage level of the inverted amplified signal is higher than the reference voltage REF, comparator 44 produces a light-level comparison output that is at a logically "low" level. When the voltage level of the inverted amplified signal is lower than the reference voltage REF, comparator 44 produces a light-level comparison output that is at a logically "high" level. The light-level comparison output, having either a logically "low" or "high" level, is supplied to light-level logic circuit 46.

The shutter status circuit 42 receives the shutter-driving control signal SH to determine whether the shutter is supposed to be open or closed. The shutter-driving control-signal SH is voltage-divided by resistors R11 and R12 while it is smoothed by a capacitor C4, and is applied to the base of a status transistor Q2. A status constant-voltage source V1 applies a status constant voltage to a resistor R13 when status transistor Q2 is switched on. The status constant voltage is inverted by an inverter 56 connected to resistor R13 and to the status transistor Q2, and then applied as an interim status signal to a delay subcircuit 58. A delay constant-voltage is applied by delay constant voltage supply V2 to a delay resistance load, including a delay variable resistor VR2 and resistor R14, connected in series to one side of delay subcircuit 58. A delay condensor C5, having a delay capacitance, is connected to delay variable resistor VR2 and resistor R14 in parallel. The delay resistance of variable resistor VR2 and resistor R14 and the delay capacitance of delay condensor C5 determine a time constant that determines the output delay time of delay subcircuit 58.

The shutter-driving control signal SH is applied as a signal where "high" and "low" levels are repeated during an exposure operation. The high levels correspond to pulses for the stepping motor that cause the shutter to move. The low levels correspond to pauses when the shutter is not being moved. A rapid succession of pulses and pauses indicate that the shutter is changing its status from closed to open and back to closed again. The time between the beginning of successive pulses is the pulse cycle time.

Figure 4:
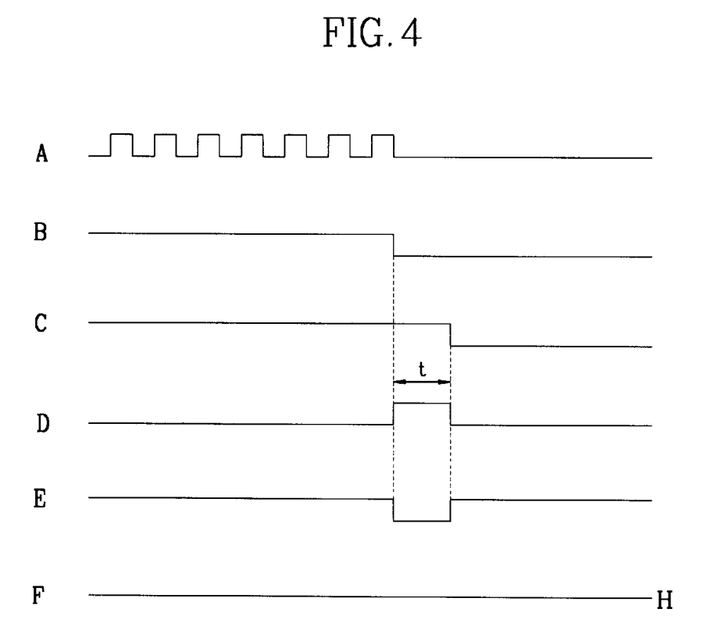
FIG. 4 shows sample waveforms of signals transmitted on several connections among the circuit structures of FIG. 2, when the shutter is operating properly.

When the wafer is not being exposed, as when the wafer is being moved, the shutter remains closed for an extended period of time. Thus there is an extended pause in which the shutter-driving control signal is maintained at a "low" level. The status transistor Q2, to which the shutter-driving control signal SH is applied, is turned on when the shutter-driving control signal SH is "high", and turned off when "low", thereby producing an inverted control signal. Inverter 56 inverts the inverted control signal to produce an interim status signal A (FIG. 4) directly proportional to the original shutter-driving control signal SH. The interim status signal A is applied to delay subcircuit 58. Delay subcircuit 58 maintains any "high" level of the interim status signal, corresponding to a pulse, for a delay time of a few seconds using a preset time constant greater than the pulse cycle time, to produce the shutter status output C. The shutter status output C is applied to light-level logic circuit 46. The shutter status output C is thereby maintained at a constant high level while pulses are occurring in rapid succession during exposure times, and switches to a constant low level one delay time after the succession of pulses stop during the wafer movement times. The signal waveforms of the interim status signal A and the shutter status output C are shown in FIG. 4 for the case when the shutter properly changes from the open state to the closed state. In FIG. 4 the duration of time interval t is the delay time.

Referring again to FIG. 3, the makeup of the light-level logic circuit 46 of the preferred embodiment of the double exposure detector 26 (FIG. 2) is described. The light-level logic circuit 46 includes an initial light-logic inverter 60 for inverting the light-level comparison output from comparator 44 and producing the first light-logic signal B. Also included is a light-logic exclusive-OR gate 62 for producing a second light-logic signal D by logically combining the first light-logic signal B from the initial inverter 60 with the shutter status output C from the shutter status circuit 42. Another light-logic inverter 64 inverts the second light-logic signal D from the exclusive-OR gate 62 to produce a third light-logic signal E. Finally, a light-logic OR gate 66 logically combines the third light-logic signal E and the shutter output C to produce the switching signal F. The signal waveforms of the first light-logic signal B, the second light-logic signal D, the third light-logic signal E, the switching signal F, and the shutter status output C are shown in FIG. 4 for the case when the shutter properly changes from the open state to the closed state.

The operation of the light-logic circuit 46 when the shutter 12 opens and closes properly is explained below with reference to FIGS. 2, 3 and 4. When the shutter-driving control signal SH is applied to shutter status circuit 42, the status constant-voltage supplied by the status constant voltage source V1 is switched by status transistor Q2 and then inverted by status inverter 56 to produce the interim status signal A which is fed to the delay subcircuit 58. The waveform of A shows a period, when "low" pauses and "high" pulses are repeated in rapid succession, corresponding to when the shutter 12 is moved through an open state during the exposure operation. The waveform of A also shows a later period, when a "low" pause is maintained for an extended time, corresponding to when exposure is not carried out, wherein the shutter 12 is closed, and the wafer 21 may be moved by the stepper. Delay subcircuit 58 produces the shutter status output C which maintains any "high" level for a preset delay time t after the voltage level drops to a "low" level. Thus in the shutter status output C, a "high" voltage level corresponds to an exposure interval when the shutter status should be "open," and a "low" voltage level corresponds to a non-exposure interval when the shutter status should be "closed."

When the shutter is actually open, a light beam is sensed by light sensor 24 with a light level above the threshold light level. When the shutter is actually fully closed the light beam is not sensed. The light sensor 24 produces the sensing signal INT which is operated on by the inverting-amplifying circuit 40 to produce the inverted-amplified signal. The inverted-amplified signal is then passed through resistor R1 and compared with the reference voltage REF passed through resistor R2 in the comparator 4. The comparator 44 produces the light-level comparison output in which the voltage level is "low" when the light sensed is above the threshold light level and is "high" when the light sensed is below the threshold light level. Thus the light-level comparison output is "low" when the shutter is actually open and is "high" when the shutter is actually closed. The light-level comparison output is then inverted in the light-logic circuit 46 by initial light-logic inverter 60 to produce the first light-logic signal B which is "high" when the shutter is actually open and "low" when the shutter is actually closed. Light-logic exclusive-OR gate 62 combines signal B with the shutter status signal C, and outputs a signal D that is "low" when signals B and C are both the same, i.e., both "high" or both "low," and is "high" when only one of signals B and C is "high." Thus D is "low" except for the delay time t after the shutter is closed because the light level and the shutter status agree. That is, the light level is above threshold when the shutter is supposed to be open, and is below threshold when the shutter is supposed to be closed. Signal D is inverted by the other light-logic inverter 64 to become signal E, which is always high, except for delay time t, because the shutter status and light levels agree. Signal E and shutter status output C are then applied to light-logic OR gate 66. OR gate 66 produces a switching signal F which is always "high," as indicated by the letter H at the right of the waveform, because E is always "high" except for the delay time t when C is "high." Thus a switching signal F that is "high" indicates no error.

When the shutter is operating properly, a "high" level of switching signal F is applied to the relay circuit and produces a low level error signal ER. Referring to FIG. 3, the relay circuit consists of a relay transistor Q1, a relay voltage source V3, and a relay 48. The switching signal F is applied to the base of the relay transistor Q1. Accordingly, when F is at a "high" level, relay transistor Q1 is conductive, current flows from voltage source V3 and opens the relay 48. When the relay is opened, the error signal ER is at a low voltage level indicating a low-error condition. Then, when the low-error level of the error signal ER is received by the exposure controller 28, no modifications are made to the normal exposure operations.

Figure 5:
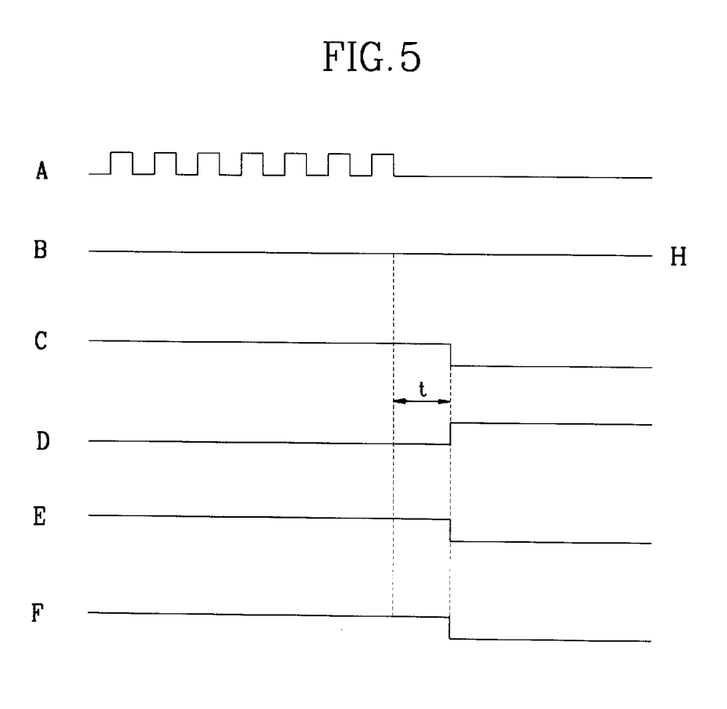
FIG. 5 shows sample waveforms of signals transmitted on several connections among the circuit structures of FIG. 2, when double exposure is occurring because the shutter is operating abnormally.

When the shutter 12 does not actually close completely when it is supposed to close, the sensor 24 will detect light above the threshold light level if the shutter 12 is opened one percent or more. Referring to FIG. 3 and FIG. 5, the level of the inverted-amplified signal applied to one input of the comparator 44 is then higher than the corresponding reference voltage REF applied to the other input. The comparator 44 always produces a light-level comparison output at a "low" voltage level. Initial light-logic inverter 60 inverts the "low" level signal, and produces the first light-logic signal B as shown in FIG. 5. Signal B is applied to light-logic exclusive-OR gate 62 with shutter status output C which produces the second light-logic signal D. Unlike in FIG. 4, signal D is now "low" during time delay t, and "high" thereafter. The "high" level of signal D indicates that the shutter should be closed but light above the threshold is being sensed. Exclusive-OR gate 62 applies signal D to the light-logic inverter 64, which outputs the third light-logic signal E. Signal E is input to the light-level OR gate 66 with the shutter status output C to produce switching signal F. Unlike in FIG. 4, when the switching signal was constantly at the "high" level, here the switching signal is at a "low" voltage level when the shutter is closed but light above the threshold is being sensed. A "low" level of the switching signal is thus a warning level of the switching signal.

Accordingly, when F is at a "low" level, relay transistor Q1 is non-conductive, no current flows from voltage source V3, and relay 48 remains closed. When the relay is closed, the error signal ER is at a "high" voltage level indicating an error condition. Now, when the high-error level of the error signal ER is received by the exposure controller 28, modifications are made to the normal exposure operations.

Thus, the relay 48 is open when the shutter is operating properly and ER is at the low-error level, and the relay 48 is closed if the shutter is not completely closed when it should be and ER is at the high-error level. Referring to FIG. 2, the exposure controller 28 judges if double exposure occurs using the level of error signal ER which is applied thereto. When the error signal ER is at a "high" voltage level indicating an error condition, the exposure controller 28 activates the alarm 32 and simultaneously controls the wafer driver 30 to stop the wafer stage 20 and hence stop the wafer 21.

For normal operation of the double exposure detector 26, a stable level of the reference voltage REF should be provided. In one embodiment of the present invention, an error signal ER is also set to a high-error level when the reference voltage REF is not stable. The preferred embodiment of the invention therefore includes a reference voltage checking circuit to produce a reference check output.

As shown in FIG. 3, the reference voltage checking circuit includes a reference comparing circuit 68 to which the reference voltage is applied while it is applied also to comparator 44, and includes a reference logic circuit 70 that is connected to the relay circuit at the relay transistor Q1. If the reference voltage level lies outside a permissible error range from the predetermined level, the reference comparing circuit produces one of two check outputs at a "low" level. An upper check output indicates whether the reference voltage is above the reference voltage predetermined level plus the permissible error range. A lower check output indicates whether the reference voltage is below the reference voltage predetermined level minus the permissible error range. If either check output is at a "low" level, the reference logic circuit produces a reference check output at a fail-check level.

A reference-checking constant-voltage supply 72 provides a stable constant-voltage for reference comparing circuit 68. The reference-checking constant-voltage supply 72 is connected to a constant-voltage source V4 through a resistor R15, and produces a checking voltage, which is smoothed by a condenser C6, to variable resistor VR3, upper check variable resistor VR4, and lower check variable resistor VR5. Reference voltage REF is added to the voltage applied to variable resistor VR3, voltage-divided by a resistor R16, and applied to one input on each of upper check comparator 74 and lower check comparator 76. Upper check comparator 74 judges if reference voltage REF exceeds the upper limit, i.e., the predetermined level plus the permissible error, and lower check comparator 76 judges if reference voltage REF falls below the lower limit, i.e., the predetermined level minus the permissible error. For this purpose, the other input of upper check comparator 74 receives a voltage corresponding to the upper limit of the reference voltage by passing the checking voltage through a resistor R17, and the other input of lower check comparator 76 receives a voltage corresponding to the lower limit of the reference voltage by passing the checking voltage through a resistor R18. Upper check comparator 74 produces a "low" level signal when the reference voltage REF exceeds the upper limit, and lower check comparator 76 produces a "low" level signal when the reference voltage REF falls below the lower limit. The reference voltage REF is stable when it lies above the lower limit and below the upper limit.

The check output signals of comparators 74 and 76 are combined by reference logic circuit 70. Reference logic circuit 70 sends to the relay transistor Q1 the reference check output which is at a "high" level when reference voltage REF is stable thus opening the relay 48 and sending an error signal ER at a low-error level, and which is at a "low" level, i.e., a fail-check level, when reference voltage REF lies outside the upper and lower limits thus closing the relay 48 and sending an error signal ER at a high-error level. The upper check output from the upper check comparator 74 is applied to reference OR gate 82 through an upper inverter 78, and the lower check output from lower check comparator 76 is applied to the reference OR gate 82 through a lower inverter 80. The output signal of OR gate 82 is an inverted check signal which is changed to the reference check output applied to the base of the relay transistor Q1 by passing through a reference check inverter 84.

Accordingly, when reference voltage REF lies between the upper and lower limits, both upper and lower check comparators 74 and 76 provide "high" level upper and lower check outputs for upper and lower inverters 78 and 80, respectively. Upper and lower inverters 78 and 80 invert these outputs to "low" level upper and lower inverted signals. The "low" level upper and lower inverted signals are combined by reference OR gate 82. Since both inputs to reference OR gate 82 are at a "low" level, OR gate 82 produces a "low" level signal and sends it to reference check inverter 84. Inverter 84 inverts this signal to a "high" level reference check output, and applies it to the base of relay transistor Q1. A high level signal applied to relay transistor Q1 produces a low-error signal that is sent to the exposure controller 28.

Conversely, if reference voltage REF falls outside the upper or lower limits, either upper or lower check comparator 74 or 76 sends a "low" signal to upper or lower check inverter 78 or 80, and one or the other sends a "high" level signal after inverting to the reference OR gate 82. Since one of the signals is "high", OR gate 82 provides a "high" level signal to reference check inverter 84, inverter 84 inverts this signal, and provides a "low" level signal corresponding to a fail-check level to the base of relay transistor Q1.

When the reference voltage REF is stable, relay transistor Q1 is turned on but can still be switched according to the state of sensing signal INT and shutter-driving control signal SH. When reference voltage REF is not stable, relay transistor Q1 is turned off and relay 48 operates, thus applying error signal ER to exposure controller 28. Referring to FIG. 2, the exposure controller 28 judges if the reference voltage is normal, using the state of error signal ER, depending on the operation of relay 48, and activates the alarm 32, and simultaneously controls wafer driver 30 to stop the wafer 21 on the stage 20 if the error signal ER is at the high-error level.

With the preferred embodiment of the present invention, the exposure controller 28 recognizes a high-error level in the error signal ER then stops the wafer 21 and activates an alarm 32, when a device area of the wafer 21 is double-exposed due to incomplete closing of the shutter or when the reference voltage REF is unstable.

Figure 6:
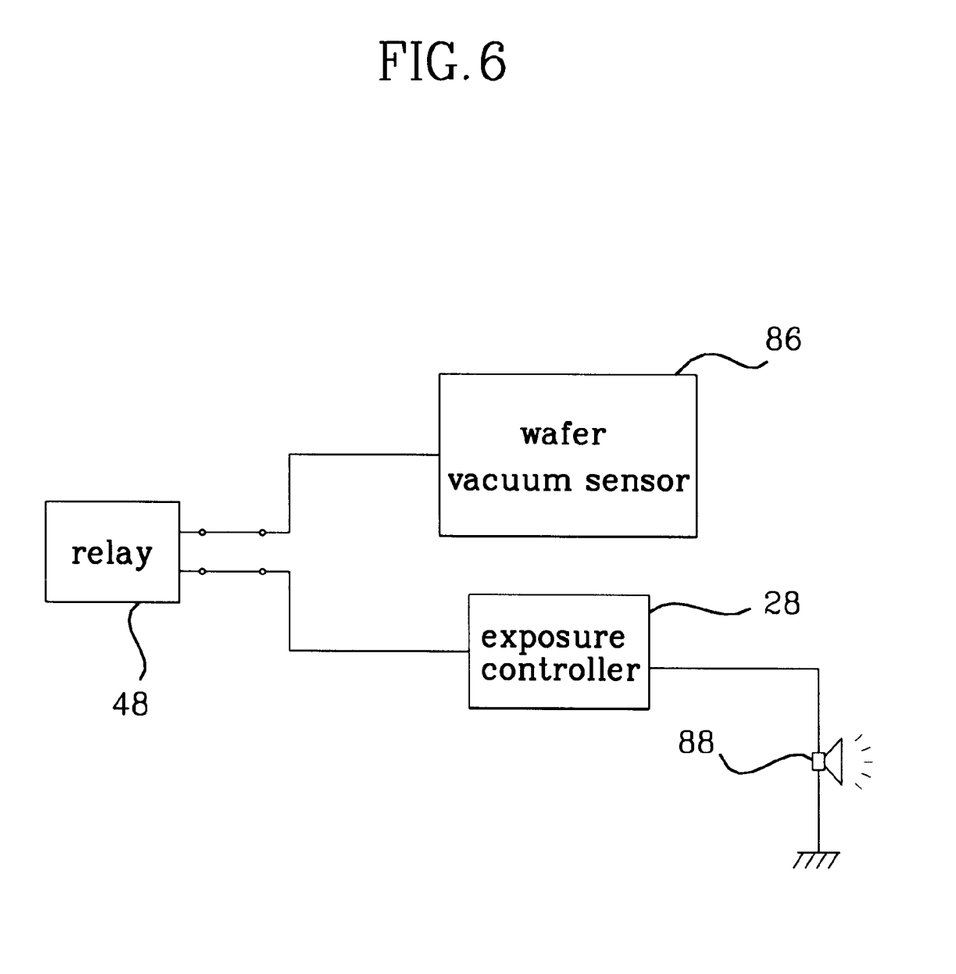
FIG. 6 is a block diagram of a configuration in which a vacuum sensor is connected to a relay circuit according to one embodiment of the present invention.

FIG. 6 shows the apparatus according to another embodiment of the present invention. Relay 48 of the double exposure detector (not shown in FIG. 6) is serially connected between exposure controller 28, and a wafer vacuum sensor 86 for sensing the vacuum state at the wafer in the stepper. In this embodiment, a poor vacuum will also produce a high-error level in the error signal ER. Thus the exposure controller 28 will respond to either a poor vacuum or incomplete closing of the shutter as an error, so as to operate buzzer 88, thus sounding an alarm.

In other embodiments of the present invention, relay 48 may be configured to apply a constant-voltage to exposure controller 28 according to its switching operation. The alarm 32 (FIG. 2) may be implemented by another aural or visual recognizing means.

Figure 7:
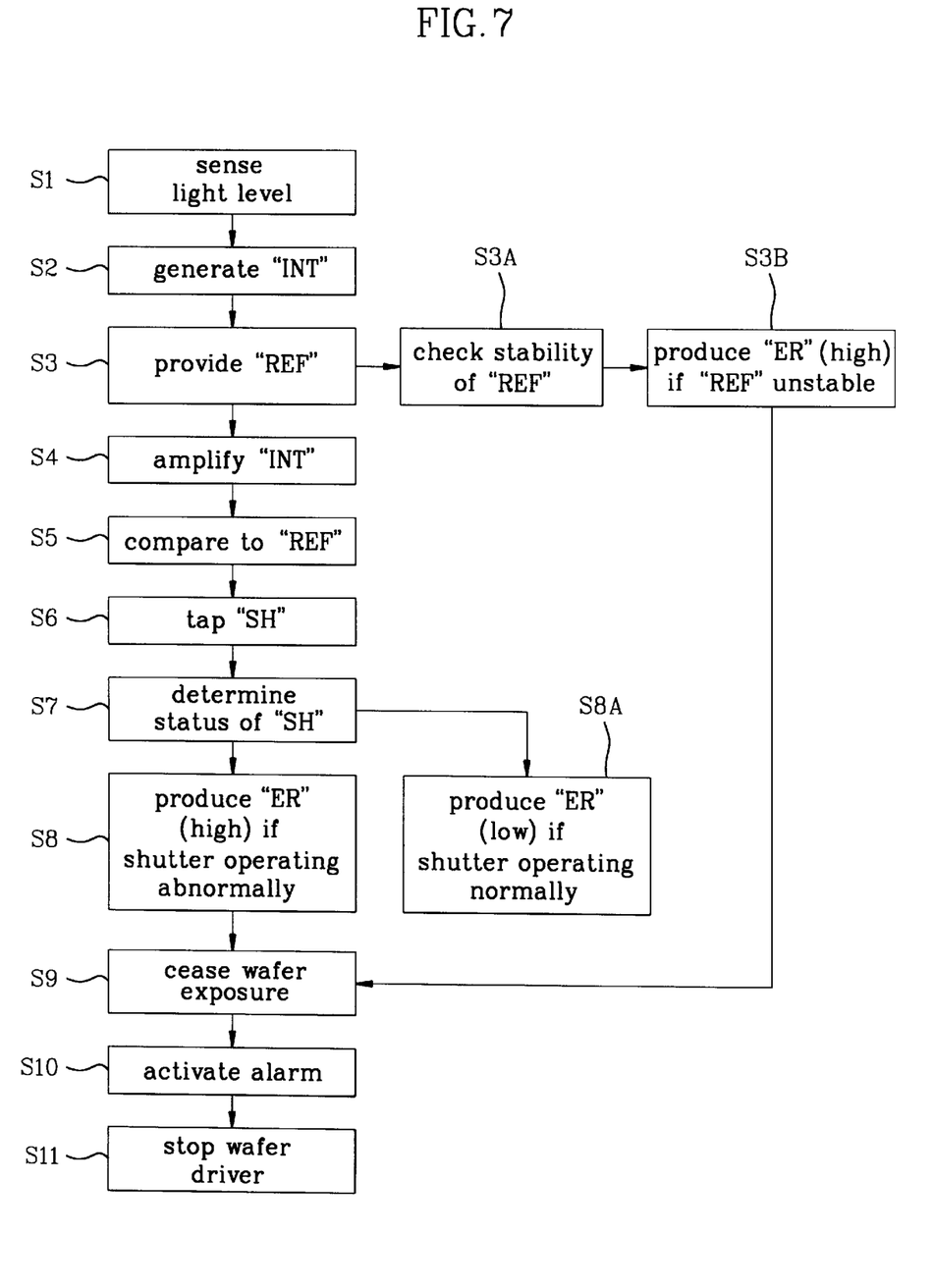
FIG. 7 is a flow chart showing the steps of a method of the present invention.

FIG. 7 illustrates a method for limiting double exposure in a stepper with a shutter. The method begins with sensing a light level of light passed by the shutter in step S1. Then, in step S2, a sensing signal INT is generated, which is representative of a voltage level corresponding to the sensed light level. In step S3 a reference voltage REF is provided, which is equivalent to the level of the sensing signal when the shutter passes light for exposing a wafer. In step S4 the sensing signal is amplified by a factor of about 100 to produce an amplified sensing signal. Next, in step S5, the amplified sensing signal is compared to the reference voltage REF to produce a light level comparison output that is at a low level when the amplified sensing signal exceeds the reference voltage. The shutter-driving control signal SH produced by the exposure controller 28 is tapped (step S6)

and applied to the double exposure detector 26 to determine when the shutter should be closed (step S7) based on the shutter-driving control signal SH. In step S8, an error signal ER at a high-error level is produced when the light level comparison output from step S5 is at the low level substantially simultaneously with when the shutter should be closed. Otherwise, a low-error level signal is produced when the amplified signal is less than the reference voltage REF when the shutter should be closed (step S8A).

In the preferred embodiment, the method also includes the steps of ceasing the exposure of a wafer in the stepper (step S9), and activating an alarm (step S10) and stopping a wafer driver (step S11) if the error signal is at the high-error level.

Optional steps in the method, used in the preferred embodiment include checking that the reference voltage is stable (step S3A), after the step of establishing the reference voltage (step S3); and setting the error signal to the high-error level (step S3B) if the reference voltage is not stable.

Further options in the method include vacuum sensing a vacuum at the wafer being exposed in the stepper, and then setting the error signal to a high-error level if the vacuum is poor.

According to the present invention, it is possible to perceive or detect that double exposure is being caused by incomplete closing of the shutter during the operation of the stepper. Thus, if an error occurs in the shutter operation, the wafer exposing process can be stopped immediately. By doing so, more device areas on the wafer will not be subject to double exposure and fewer defective devices will be generated, whereby the reliability of the stepper will be improved and production yields will increase.

It will be apparent to those skilled in the art that various modifications and variations can be made in the apparatus of the present invention for limiting double exposure in a stepper without departing from the spirit or scope of the invention. Thus, it is intended that the present invention cover the modifications to and variations of this invention provided they come within the scope of the appended claims and their equivalents.

What is claimed is:

1. An apparatus for limiting double exposure in a stepper with a shutter that alternately passes and blocks a light beam for fabrication of semiconductor devices, the apparatus comprising:

a light sensor that detects light passed by the shutter and produces a sensing signal related to the light passed;

a reference voltage supply outputting a reference voltage which is directly proportional to the level of the sensing signal when the shutter passes light for exposing a wafer;

a light-level comparison circuit, connected to the sensor and the reference voltage supply, which receives the sensing signal and the reference voltage and outputs a light-level comparison output;

a shutter status circuit which determines a shutter status based on a shutter-driving control signal;

a logic circuit, connected to the shutter status circuit and the light-level comparison circuit, which receives the shutter status and the light-level comparison output, and outputs an error signal when the light-level comparison output indicates light passed by the shutter exceeds a threshold light level when the shutter status indicates the shutter should be closed; and an exposure controller, connected to the logic circuit and the shutter, that receives the output of the logic circuit and produces a shutter-driving control signal in accordance therewith, the shutter-driving control signal being supplied to the shutter.

2. The apparatus of claim 1, wherein the light sensor is an integral light sensor.

3. The apparatus of claim 1, logic circuit comprising:

a light-level logic circuit connected to the shutter status circuit and the light-level comparison circuit, for receiving the shutter status and the light-level comparison output and producing a switching signal, wherein the switching signal is at a warning level when the light passed by the shutter exceeds the threshold light level when the shutter status indicates the shutter should be closed; and a relay circuit connected to the light-level logic circuit and the exposure controller, for receiving the switching signal and producing the error signal when the switching signal is at the warning level.

4. The apparatus of claim 3, the light-level comparison circuit further comprising:

an inverting-amplifying circuit connected to the sensor, for receiving the sensing signal and producing an inverted-amplified signal; and a comparison subcircuit connected to the reference voltage supply and the inverting-amplifying circuit, for receiving the reference voltage and the inverted amplified signal and producing the light-level comparison output.

5. The apparatus of claim 4, the inverting-amplifying circuit comprising:

a first light-level amplifier connected to the sensor that inverts the sensing signal and produces an inverted sensing signal;

a second light-level amplifier connected to the first light-level amplifier that amplifies the inverted sensing signal and produces a partly amplified inverted sensing signal; and a third light-level amplifier, connected to the second light-level amplifier, that amplifies the partly amplified inverted sensing signal and produces the inverted-amplified signal.

6. The apparatus of claim 5, the inverting-amplifying circuit further comprising a first variable load resistor connected to the third light-level amplifier, that adjusts an amplification factor of the third light-level amplifier.

7. The apparatus of claim 1, the shutter status circuit comprising:

a switching subcircuit communicating with the exposure controller, for receiving the shutter-driving control signal and producing an interim status signal in which a high status level indicates a pulse related to a desired change in a state of the shutter and a low status level indicates a pause related to a desired maintenance of the state of the shutter; and a delay subcircuit communicating with the switching subcircuit, for receiving the interim status signal and delaying a change from the high status level to the low status level in the interim status signal by a delay time, thereby producing the shutter status.

8. The apparatus as claimed in claim 7, the switching subcircuit comprising:

a status transistor having a base communicating with the exposure controller, the status base for receiving a modified shutter-driving control signal;

a status voltage source communicating with a status collector of the status transistor for providing a status constant voltage; and a status inverter connected to the status collector, thereby inverting the status constant voltage as the status transistor responds to the shutter-driving control signal to produce the interim status signal.

9. The apparatus of claim 7, further comprising:

a delay condenser connected to the delay subcircuit and having a delay capacitance; and a delay load connected to the delay subcircuit, having a delay resistance, wherein the delay capacitance and the delay resistance determine the delay time of the delay subcircuit, wherein a time between two pulses in succession while a wafer is being exposed is a pulse cycle time, and wherein the delay time is greater than the pulse cycle time.

10. The apparatus of claim 9, the delay load comprising a delay variable resistor.

11. The apparatus of claim 3, the light-level logic circuit comprising:

a light-logic exclusive-OR gate communicating with the light-level comparison circuit and connected to the shutter status circuit, for receiving a first light-logic signal related to the light-level comparison output and for receiving the shutter status, and producing a second light-logic signal;

a light-logic inverter connected to the light-logic exclusive-OR gate, for receiving the second light-logic signal and inverting the second light-logic signal to produce a third light-logic signal; and a light-logic OR gate connected to the light-logic inverter and the shutter status circuit, for receiving the third light-logic signal and the shutter status and producing the switching signal.

12. The apparatus of claim 11, the light-level logic circuit further comprising another light-logic inverter connected to the light-level comparison circuit and the light-logic exclusive-OR gate, for receiving the light-level comparison output and inverting the light-level comparison output to produce the first light-logic signal, wherein the light-level comparison output has a low level when a level of the sensing signal is higher than an actual level of the reference voltage.

13. The apparatus of claim 3, the relay circuit comprising:

a relay transistor having a base connected to the light-level logic circuit, the base receiving the switching signal; and a relay connected to a collector of the relay transistor, operating to generate the error signal as the relay transistor responds to the switching signal.

14. The apparatus of claim 3, further comprising a reference voltage checking circuit, connected to the reference voltage supply, for receiving the reference voltage and determining if the reference voltage has a level outside a permissible error range from the predetermined level.

15. The apparatus of claim 14, wherein the checking circuit produces a reference check output that is at a fail-check level when the reference voltage has a level outside the permissible error range from the predetermined level;

the relay circuit is connected to the checking circuit and receives the reference check output; and the relay circuit produces the error signal when the reference check output is at the fail-check level.

16. The apparatus of claim 15, the reference voltage checking circuit comprising:

a reference-checking constant-voltage supply for producing a stable checking voltage substantially at a predetermined checking level;

a reference comparing circuit, connected to the reference voltage supply and to the reference-checking constant-voltage supply, for receiving the reference voltage and the checking voltage and producing an upper check output which indicates when the reference voltage is greater than the reference voltage predetermined level plus the permissible error range, and producing a lower check output indicating when the reference voltage is less than the reference voltage predetermined level minus the permissible error range; and a reference logic circuit, connected to the reference comparing circuit and the relay circuit, for receiving the upper check output and the lower check output and producing the reference check output and sending the reference check output to the relay circuit.

17. The apparatus of claim 16, the reference comparing circuit comprising:

a upper check variable resistor connected to the reference-checking constant-voltage supply, for receiving the checking voltage and producing an upper check voltage;

a lower check variable resistor connected to the reference-checking constant-voltage supply, for receiving the checking voltage and producing a lower check voltage;

an upper check comparator, connected to the upper check variable resistor and communicating with the reference voltage supply, for receiving the upper check voltage and a modified reference voltage and producing the upper check output; and a lower check comparator, connected to the lower check variable resistor and communicating with the reference voltage supply, for receiving the lower check voltage and the modified reference voltage and producing the lower check output.

18. The apparatus of claim 16, the reference logic circuit comprising:

an upper inverter connected to the reference comparing circuit, for receiving the upper check output and producing an inverted upper signal;

a lower inverter connected to the reference comparing circuit, for receiving the lower check output and producing an inverted lower signal;

a reference OR gate connected to the upper inverter and the lower inverter, for receiving the inverted upper signal and the inverted lower signal and producing an inverted check signal; and a reference check inverter, connected to the reference OR gate and the relay circuit, for receiving the inverted check signal and producing the reference check output and sends it to the relay circuit.

19. The apparatus of claim 16, wherein the reference voltage supply communicates with the reference-checking constant-voltage supply to stabilize the reference voltage.

20. The apparatus of claim 1, wherein the shutter-driving control signal is changed to indicate no further exposure when the error signal is at the high-error level.

21. The apparatus of claim 20, further comprising an alarm connected to the exposure controller, wherein the exposure controller activates the alarm when the error signal is at the high-error level.

22. The apparatus of claim 20, further comprising a wafer driver connected to the exposure controller, wherein the exposure controller stops operation of the wafer driver when the error signal is at the high-error level, whereby a wafer being exposed is kept stationary.

23. The apparatus of claim 3, further comprising an alarm connected to the relay circuit, wherein the alarm activates when the error signal is at the high-error level.

24. The apparatus of claim 3, further comprising a wafer vacuum sensor connected to the relay circuit, which produces a vacuum signal at a poor-vacuum level when a vacuum level at a wafer being exposed is poor, wherein the error signal is at the high-error level when the vacuum signal is at the poor-vacuum level.

25. The apparatus of claim 24, further comprising an alarm connected to the exposure controller, wherein the exposure controller activates the alarm when the error signal is at the high-error level.

26. A method for limiting double exposure in a stepper with a shutter that alternately passes and blocks a light beam for fabrication of semiconductor devices, the method comprising:

sensing a light level of light passed by the shutter;

generating a sensing signal representative of a voltage level corresponding to the sensed light level;

establishing a reference voltage which is directly proportional to the level of the sensing signal when the shutter passes light for exposing a wafer;

amplifying the sensing signal to produce an amplified sensing signal;

comparing the amplified sensing signal to the reference voltage to produce a light level comparison output; and producing an error signal when the light level comparison output indicates that the sensing signal exceeds the reference voltage and a shutter-driving control signal indicates the shutter should be closed.

27. The method of claim 26, after the producing of the error signal, further comprising ceasing the exposure of a wafer in the stepper if the error signal is produced.

28. The method of claim 26, after the producing of the error signal, further comprising activating an alarm if the error signal is produced.

29. The method of claim 26, after the producing of the error signal, further comprising stopping a wafer driver if the error signal is produced.

30. The method of claim 26, further comprising:

checking whether the reference voltage is stable, after the establishing of the reference voltage; and setting the error signal to the high-error level if the reference voltage is not stable, during the producing of the error signal.

31. The method of claim 26, further comprising:

sensing a vacuum state at the wafer being exposed in the stepper; and producing the error signal if the vacuum is poor, during the producing of the error signal.

32. The method of claim 26, wherein the amplifying includes multiplying the sensing signal by one hundred.

* * * * *